United States Patent
Nicolai et al.

(10) Patent No.: US 6,463,997 B1
(45) Date of Patent: Oct. 15, 2002

(54) CONTROL CABINET WITH AIR CONDITIONING DEVICE

(75) Inventors: Walter Nicolai; Adam Pawlowski, both of Eschenburg; Harald Perlitz, Dillenburg, all of (DE)

(73) Assignee: Rittal-Werk Rudolf Loh GmbH & Co. KG, Herborn (DE)

( * ) Notice: Subject to any disclaimer, the term of this patent is extended or adjusted under 35 U.S.C. 154(b) by 0 days.

(21) Appl. No.: 09/601,758

(22) PCT Filed: Dec. 24, 1998

(86) PCT No.: PCT/EP98/08449

§ 371 (c)(1),
(2), (4) Date: Oct. 18, 2000

(87) PCT Pub. No.: WO99/40658

PCT Pub. Date: Aug. 12, 1999

(30) Foreign Application Priority Data

Feb. 7, 1998 (DE) .......................... 198 04 900

(51) Int. Cl.[7] .................................. F28F 7/00
(52) U.S. Cl. ...................... 165/80.2; 361/695
(58) Field of Search .............. 454/184; 361/695, 361/694; 174/16.1; 165/80.2; 62/259.2

(56) References Cited

U.S. PATENT DOCUMENTS

| | | | | |
|---|---|---|---|---|
| 3,120,166 A | * | 2/1964 | Lyman | 454/184 |
| 5,467,250 A | * | 11/1995 | Howard et al. | 361/696 |
| 5,544,012 A | * | 8/1996 | Koike | 361/695 |
| 5,657,641 A | * | 8/1997 | Cunningham et al. | 62/263 |
| 5,718,628 A | * | 2/1998 | Nakazato et al. | 454/184 |
| 5,963,425 A | * | 10/1999 | Chrysler et al. | 361/695 |

FOREIGN PATENT DOCUMENTS

| | | |
|---|---|---|
| DE | 41 35 894 | 11/1992 |
| DE | 196 09 794 | 9/1997 |
| EP | 0 312 372 | 4/1989 |
| FR | 2 193 303 | 2/1974 |

\* cited by examiner

*Primary Examiner*—Harold Joyce
*Assistant Examiner*—Derek S. Boles
(74) *Attorney, Agent, or Firm*—Pauley Petersen Kinne & Erickson

(57) ABSTRACT

A control cabinet with an air conditioning device mounted inside the control cabinet and physically connected to the inside of the control cabinet via an air condution channel. The inside of the control channel is surrounded by side walls and at least one door. This invention provides efficient air conditioning inside the cabinet. For this purpose, an intermediate wall is placed at a distance from the side wall and an air collecting channel created between the side wall and the intermediate wall is physically connected to the air conduction channel of the air conditioning device through input openings and to the inside of the control cabinet through at least one passage.

15 Claims, 2 Drawing Sheets

CONTROL CABINET WITH AIR CONDITIONING DEVICE

BACKGROUND OF THE INVENTION

1. Field of the Invention

This invention relates to a switchgear cabinet with a climate-control arrangement, which is installed in the switchgear cabinet interior, and is in spatial connection with the switchgear cabinet interior through an air guidance conduit, and the switchgear cabinet interior is enclosed by lateral walls and at least one cabinet door.

2. Description of Related Art

Such a switchgear cabinet is known from the company prospectus "Rittal Handbuch 29" [Rittal Manual 29], page 520. With such switchgear cabinets the climate-control arrangement is designed as a cooling apparatus, which can be mounted at any arbitrary level in the switchgear cabinet interior. The climate-control arrangement aspirates heated air from the switchgear cabinet interior and conducts it to an evaporator of a cooling circuit. There, the temperature level of the air is lowered. Thereafter, the climatized air can again be released into the switchgear cabinet interior by a fan.

SUMMARY OF THE INVENTION

It is one object of this invention to produce a switchgear cabinet of the type previously mentioned, with which an effective climate-control of the air in the switchgear cabinet interior is possible.

This object is attained with an intermediate wall spaced apart from the lateral wall to create an air collection conduit between the lateral wall and the intermediate wall, which is in spatial connection with the air guidance conduit of the climate-control arrangement via inlet openings, and with the switchgear cabinet interior via one or several openings.

The air from the switchgear cabinet interior which, for example, is considerably heated, can be pre-climatized in the air collection circuit, wherein heat is exchanged with the surroundings via the lateral wall. Thereafter the pre-climatized air can be conducted to the climate-control arrangement and further cooled there. An effective climate-control is possible with such an arrangement, wherein the lateral wall can be used as a heat exchanger. In particular, only a small cold output is required for the climate-control arrangement.

In one preferred embodiment of this invention the intermediate wall has several rows of openings, wherein the rows are arranged above each other in the vertical direction. The air guidance conduit of the climate-control arrangement is connected to the air collection conduit via at least one of the openings. The intermediate wall allows a flexible installation of the climate-control arrangement which can be selectively associated with one of the rows of openings. The connection of the air collection conduit with the switchgear cabinet interior can be provided via the other remaining openings.

For example, the air can be aspirated out of the switchgear cabinet interior from different levels. In this case the intermediate wall has at least three rows of openings, wherein one row is arranged in the upper ceiling area, one row in the lower floor area and a further row in the center area of the intermediate wall.

To be able to aspirate air from a defined area of the switchgear cabinet, or to release it there, one or several of the openings can be selectively closed by covers.

In another preferred embodiment the climate-control arrangement aspirates heated air from the air collection conduit with at least one fan and conducts it to a heat exchanger. The air climatized at the heat exchanger can be released through one or several outlets into the switchgear cabinet interior. If several outlets are employed, they are preferably but not necessarily selectively closable, so that the connection with the switchgear cabinet interior can only take place at predefined locations.

In accordance with this invention, an efficient climate-control arrangement is distinguished because it has a cooling device with an evaporator and a condenser, wherein the evaporator is arranged in the air guidance conduit, and the condenser is connected with the surroundings via an exterior circuit. The exterior air conducted in the exterior circuit can be released to the surroundings, or respectively aspirated from it, via openings in the cabinet door or in a lateral wall. So that even cooling of the switchgear cabinet interior is possible, intermediate walls are allocated to at least two lateral walls, and the climate-control arrangement is in spatial connection with the air collection conduits formed between the lateral walls and the intermediate walls.

In accordance with this invention, one or several fans can be fastened by screws at the openings of the intermediate wall for helping convey air.

BRIEF DESCRIPTION OF THE DRAWINGS

This invention will be explained in greater detail in what follows by means of an embodiment represented in each drawing, wherein.

DESCRIPTION OF PREFERRED EMBODIMENTS

Figure 1:
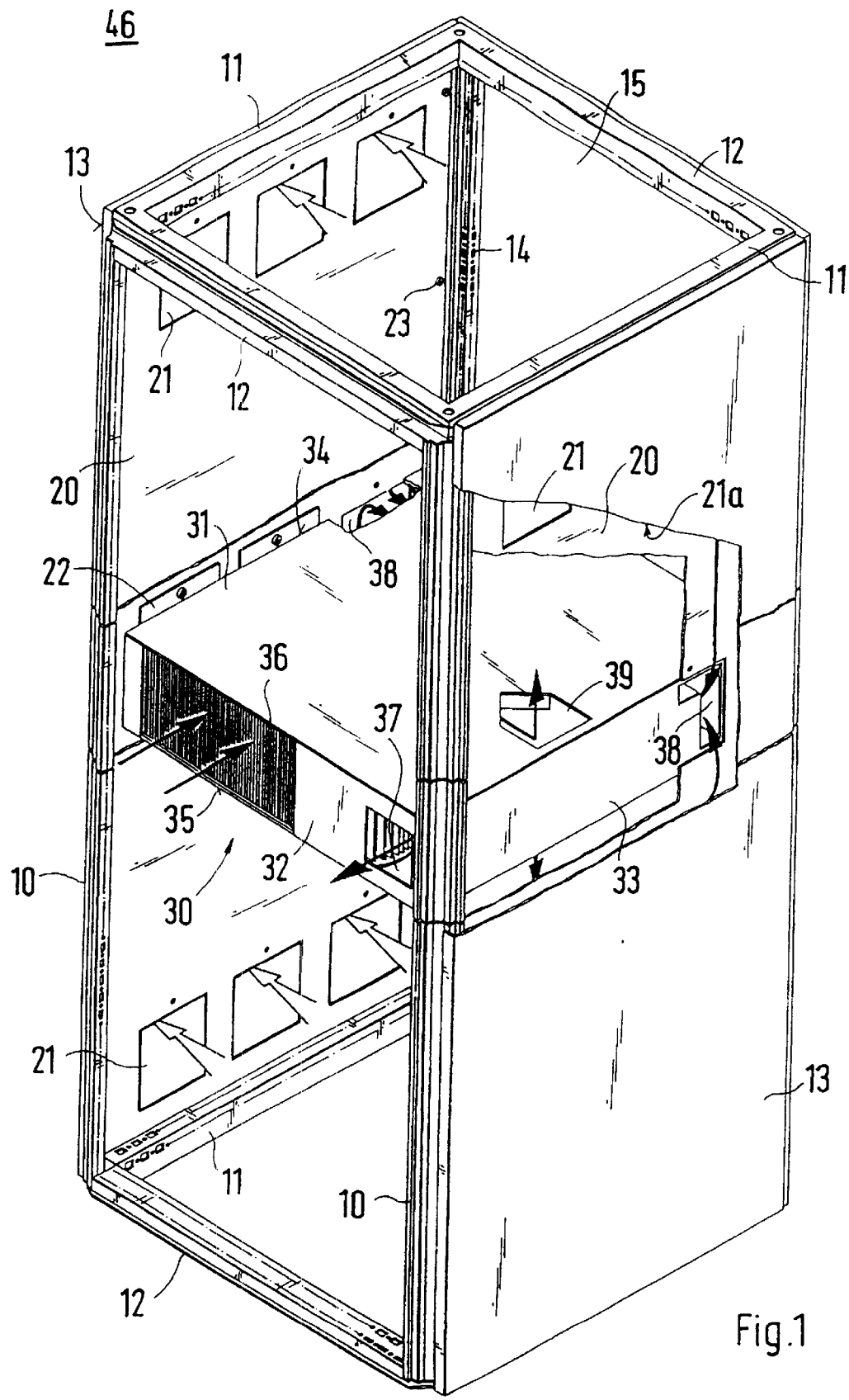
FIG. 1 shows a switchgear cabinet with a climate-control arrangement installed therein, in a perspective lateral view and partially in section.

A switchgear cabinet having a rack is shown in FIG. 1. The rack is assembled from horizontal and vertical profiled frame sections 10 and 11, 12. Here, the horizontal profiled frame sections 11, 12 form a bottom frame or a top frame, which are connected with each other via the vertical profiled frame sections 10. The rack is enclosed by means of lateral walls 13, 15. In this case the lateral wall 15 simultaneously constitutes the rear wall. A cabinet door, not shown in the drawings for reasons of clarity, can be hinged on the front of the switchgear cabinet. An intermediate wall 20 is erected, spaced apart parallel from each of the lateral walls 13. Here, the intermediate wall 20 covers the entire field enclosed by the lateral vertical profiled frame sections 10 and the horizontal profiled frame sections 11 designed as depth struts. An air collection conduit 21a is formed between the lateral wall 13 and the intermediate wall 21. This air collection circuit 21a is in spatial connection with the switchgear cabinet interior via three rows of openings 21. Three openings 21 are provided for each row. The rows are arranged on different levels, wherein the upper row is arranged in the ceiling area, the lower row in the floor area and the center row in the center area of the switchgear cabinet. The intermediate wall 20 is symmetrically designed for simplifying the mounting. The individual openings 21 can be selectively closed by means of covers 22.

In one embodiment, a climate-control arrangement 30 is allocated to the respective row of openings 21 in the center area of the switchgear cabinet. The climate-control arrangement 30 is accommodated in a housing having a horizontal ceiling and a bottom wall 31 and 35. The ceiling 31 is connected with the bottom wall 35 via vertical lateral elements 33, 34, and a front wall 32. The lateral elements 33 have inlet openings 38, which provide access to an air guidance conduit 43 (see FIG. 2) in the interior of the climate-control arrangement 30. The inlet openings 38 are connected to an opening 21, so that a spatial connection of the air collection conduit 21a with the air guidance conduit 43 is created.

Outlets 39 are cut into the cover and bottom walls 31 and 35. The outlets 39 are also in spatial connection with the air guidance conduit 43. The guidance of the air inside the air guidance conduit 43 is explained in detail later by reference to FIG. 2. A condenser 36 is installed in the front wall 32, through which ambient air can flow. The ambient air is aspirated through openings in the cabinet door, is conducted through the climate-control arrangement 30 and thereafter returned back to the surroundings 46 through an outlet opening 37.

Figure 2:
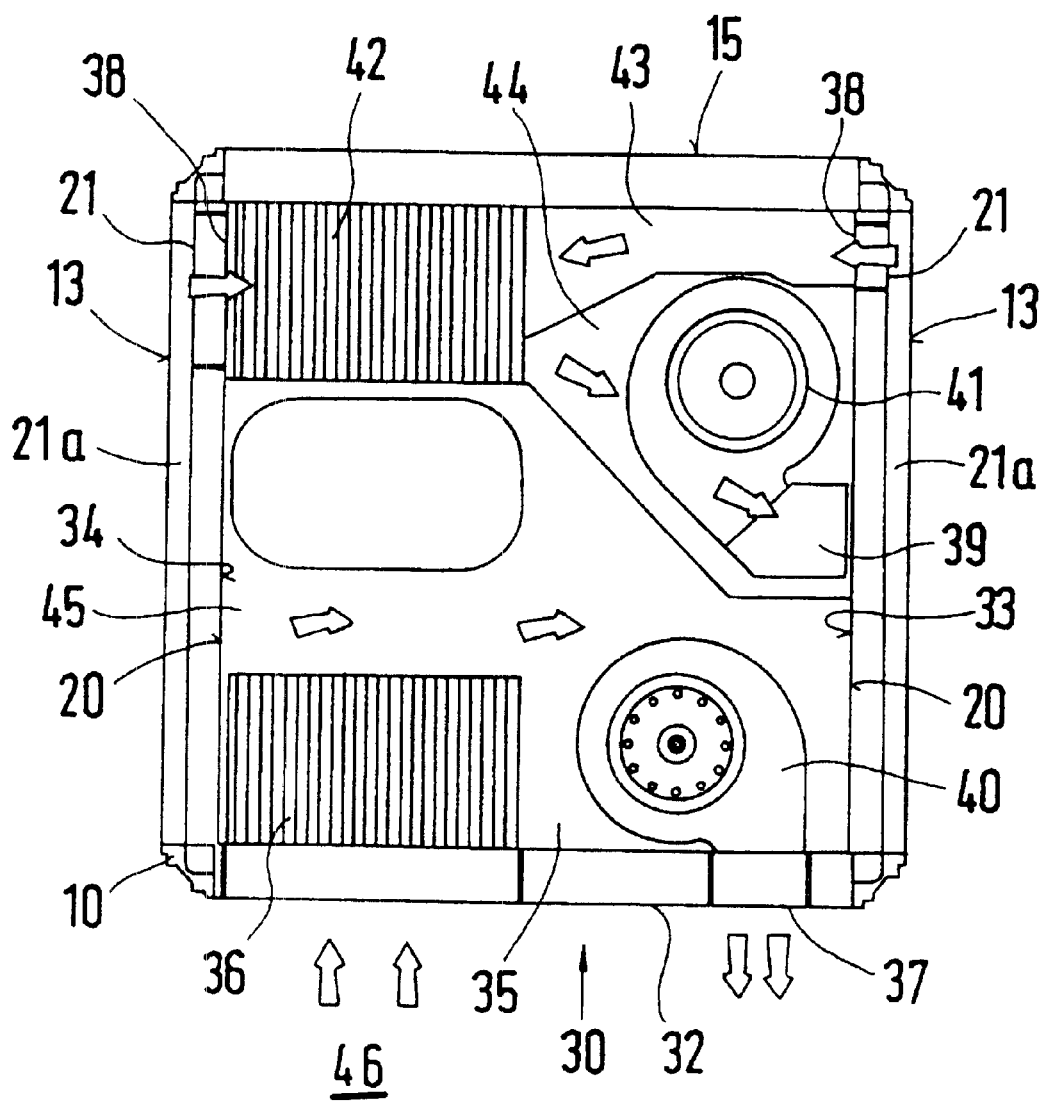
FIG. 2 shows a schematic top view of a horizontal section taken through the installed climate-control arrangement.

Reference is made to FIG. 2 in what follows for explaining the mode of operation. The drawing figure shows a horizontal section taken through the climate climate-control arrangement 30. FIG. 2 represents the air guidance conduit 43 which follows the inlet openings 38. An evaporator 42 of a refrigeration cycle is accommodated in the air guidance conduit 43. The air guidance conduit 43 terminates in a further air guidance conduit 44 downstream of the evaporator. A fan 41 is housed in the air guidance circuit 44. Heated air is aspirated by means of the fan 41 from the interior of the switchgear cabinet through the openings 21 into the air collection conduit 21 a. This air reaches the air guidance conduit 43 of the climate-control arrangement 30 through the inlet openings 38. There, the air flows past the evaporator 42 and is cooled in the process. The air climatized in this manner is thereafter sent into the interior of the switchgear cabinet by means of the ventilator 41 through the outlets 39 in the bottom and/or cover wall 35, 31.

The climate-control arrangement 30 has an exterior circuit 45, in which the condenser 36 is housed. Moreover, a fan 40 is installed in the exterior circuit 45, which aspirates the ambient air through the condenser 36. A heat exchange takes place at the condenser, which is used for cooling the air in the switchgear cabinet interior. Downstream of the condenser, the exterior air is released into the surroundings 46 again through the outlet openings 37.

In accordance with this invention, the climate-control arrangement 30 can be fastened on the row of openings allocated to the bottom or the ceiling of the switchgear cabinet. If, for example, the climate-control arrangement 30 is installed in the bottom area, the outlet 39, which is cut in the bottom wall 35, can be closed by means of an appropriate cover plate. The outlet 39 in the ceiling 31 can also be closed correspondingly when the climate-control arrangement is accommodated in the ceiling area of the switchgear cabinet. The climate-control arrangement need not extend over an entire width of the switchgear cabinet but it can have appropriately smaller dimensions. Then the inlet opening 38 of a lateral element 33, which is not allocated to an intermediate wall, can aspirate air directly from the interior of the switchgear cabinet. However, the inlet opening 38 can alternatively also be closed.

What is claimed is:

1. In a switchgear cabinet having a frame formed by vertical profiled sections and horizontal profiled sections, a climate-control device installed in a switchgear cabinet interior, the climate-control device in communication with the switchgear cabinet interior via an air guidance conduit, and the switchgear cabinet interior being enclosed by lateral walls and at least one cabinet door, the improvement comprising:

an intermediate wall (20) spaced apart from one of the lateral walls (13), on one side of the frame the intermediate wall (20) extending entirely between and connected to the vertical profiled sections and the horizontal profiled sections; and an air collection conduit (21a) formed between the lateral wall (13) and the intermediate wall (20), and the air collection conduit (21 a) in communication with the air guidance conduit (43) of the climate-control device (30) via a plurality of inlet openings (38) in lateral elements (33, 34) and in communication with the switchgear cabinet interior via at least one opening (21) in the intermediate wall (20).

2. In the switchgear cabinet in accordance with claim 1, wherein the intermediate wall (20) has a plurality of rows of the at least one opening (21), wherein the rows are arranged above each other in a vertical direction, and the air guidance conduit (43) of the climate-control device (30) is connected to the air collection conduit (21a) via the at least one opening (21).

3. In the switchgear cabinet in accordance with claim 2, wherein the intermediate wall (20) has at least three of the rows of the at least one opening (21), wherein a first row of the rows is arranged in an upper ceiling area, a second row of the rows is arranged in a lower floor area and a third row of the rows is arranged in a center area of the intermediate wall (20).

4. In the switchgear cabinet in accordance with claim 3, wherein the at least
one opening (21) is each selectively closed by a cover (22).

5. In the switchgear cabinet in accordance with claim 4, wherein the climate-control device (30) aspirates heated air from the air collection conduit (21a) via at least one fan (41) and conducts the heated air to a heat exchanger (42), and the heated air is climatized at the heat exchanger (42) and released through at least one outlet (39) of at least one of a bottom wall (35) and a cover wall (31) into the switchgear cabinet interior.

6. In the switchgear cabinet in accordance with claim 5, wherein the climate-control device (30) comprises a cooling device with an evaporator (42) and a condenser (36), wherein the evaporator (42) is arranged in the air guidance conduit (43), the condenser (36) is connected with surroundings (46) via an exterior circuit (45), and exterior air conducted in the exterior circuit (45) is one of released to and aspirated from the surroundings (46) via openings in one of the cabinet door and the lateral wall (13, 15).

7. In the switchgear cabinet in accordance with claim 6, wherein the intermediate wall (20) corresponds to and is spaced apart from each of at least two of the lateral walls (13), and the climate-control device (30) is in communication with the air collection conduits (21a) formed between the lateral wall (13) and the intermediate wall (20).

8. In the switchgear cabinet in accordance with claim 7, wherein the air guidance conduit (43) terminates in the at least one outlet (39).

9. In the switchgear cabinet in accordance with claim 8, wherein a fan is installed at the at least one opening (21) of the intermediate wall (20) and conveys air between the switchgear cabinet interior and the air collection conduit (21a).

10. In the switchgear cabinet in accordance with claim 2, wherein the at least one opening (21) is each selectively closed by a cover (22).

11. In the switchgear cabinet in accordance with claim 1, wherein the climate-control device (30) aspirates heated air from the air collection conduit (21a) via at least one fan (41) and conducts the heated air to a heat exchanger (42), and the heated air is climatized at a heat exchanger (42) and released through at least one outlet (39) of at least one of a bottom wall (35) and a cover wall (31) into the switchgear cabinet interior.

12. In the switchgear cabinet in accordance with claim 1, wherein the climate-control device (30) comprises a cooling device with an evaporator (42) and a condenser (36), wherein the evaporator (42) is arranged in the air guidance conduit (43), the condenser (36) is connected with surroundings (46) via an exterior circuit (45), and exterior air conducted in the exterior circuit (45) is one of released to and aspirated from the surroundings (46) via openings in one of the cabinet door and the lateral wall (13, 15).

13. In the switchgear cabinet in accordance with claim 1, wherein the intermediate wall (20) corresponds to and is spaced apart from each of at least two of the lateral walls (13), and the climate-control device (30) is in communication with the air collection conduits (21a) formed between the lateral wall (13) and the intermediate wall (20).

14. In the switchgear cabinet in accordance with claim 1, wherein the air guidance conduit (43) terminates in at least one outlet (39) of at least one of a bottom wall (35) and a cover wall (31).

15. In the switchgear cabinet in accordance with claim 1, wherein a fan is installed at the at least one opening (21) of the intermediate wall (20) and conveys air between. the switchgear cabinet interior and the air collection conduit (21a).

* * * * *